United States Patent
Wang et al.

(10) Patent No.: US 9,508,811 B2
(45) Date of Patent: Nov. 29, 2016

(54) SEMI-FLOATING-GATE DEVICE AND ITS MANUFACTURING METHOD

(71) Applicant: Fudan University, Shanghai (CN)

(72) Inventors: Pengfei Wang, Shanghai (CN); Wei Zhang, Shanghai (CN); Qingqing Sun, Shanghai (CN)

(73) Assignee: Fudan University, Shanghai (CN)

( * ) Notice: Subject to any disclaimer, the term of this patent is extended or adjusted under 35 U.S.C. 154(b) by 0 days.

(21) Appl. No.: 14/651,997

(22) PCT Filed: Apr. 29, 2014

(86) PCT No.: PCT/CN2014/076438
§ 371 (c)(1),
(2) Date: Jun. 12, 2015

(87) PCT Pub. No.: WO2014/177045
PCT Pub. Date: Nov. 6, 2014

(65) Prior Publication Data
US 2015/0325663 A1    Nov. 12, 2015

(30) Foreign Application Priority Data

May 2, 2013  (CN) .......................... 2013 1 0158971

(51) Int. Cl.
*H01L 29/788* (2006.01)
*H01L 21/336* (2006.01)
(Continued)

(52) U.S. Cl.
CPC ....... *H01L 29/42324* (2013.01); *H01L 21/265* (2013.01); *H01L 21/28273* (2013.01);
(Continued)

(58) Field of Classification Search
CPC .................... H01L 29/42324; H01L 29/4916; H01L 27/11521; H01L 27/11556; H01L 21/265; H01L 21/28273; H01L 21/28525; H01L 21/30604; H01L 21/3085; H01L 21/3086
USPC ......... 257/316, 326, E21.422; 438/588, 257, 438/264
See application file for complete search history.

(56) References Cited

U.S. PATENT DOCUMENTS

2004/0000688 A1\* 1/2004 Harari ............... H01L 27/11553
257/315
2004/0130947 A1   7/2004 Fan et al.
(Continued)

FOREIGN PATENT DOCUMENTS

CN    1540762 A    10/2004
CN    101819975 A   9/2010
(Continued)

OTHER PUBLICATIONS

International Search Report for Application No. PCT/CN 2014/076438 dated Jul. 15, 2014.

*Primary Examiner* — Dzung Tran
(74) *Attorney, Agent, or Firm* — Jenkins, Wilson, Taylor & Hunt, P.A.

(57) ABSTRACT

The disclosure, belonging to the technological field of semiconductor memory, specifically relates to a semi-floating-gate device which comprises at least a semiconductor substrate, a source region, a drain region, a floating gate, a control gate, a perpendicular channel region and a gated p-n junction diode used to connect the floating gate and the substrate. The semi-floating-gate device disclosed in the disclosure using the floating gate to store information and realizing charging or discharging of the floating gate through a gated p-n junction diode boasts small unit area, high chip density, low operating voltage in data storage and strong ability in data retain.

4 Claims, 6 Drawing Sheets

(51) Int. Cl.
*H01L 21/4763* (2006.01)
*H01L 29/423* (2006.01)
*H01L 27/115* (2006.01)
*H01L 21/306* (2006.01)
*H01L 21/308* (2006.01)
*H01L 21/265* (2006.01)
*H01L 21/285* (2006.01)
*H01L 29/49* (2006.01)
*H01L 29/40* (2006.01)
*H01L 21/28* (2006.01)
*H01L 29/66* (2006.01)
*H01L 29/739* (2006.01)

(52) U.S. Cl.
CPC ..... *H01L21/28525* (2013.01); *H01L 21/3085* (2013.01); *H01L 21/3086* (2013.01); *H01L 21/30604* (2013.01); *H01L 27/11521* (2013.01); *H01L 27/11556* (2013.01); *H01L 29/401* (2013.01); *H01L 29/4916* (2013.01); *H01L 29/66825* (2013.01); *H01L 29/66356* (2013.01); *H01L 29/7391* (2013.01)

(56) References Cited

U.S. PATENT DOCUMENTS

| | | | | |
|---|---|---|---|---|
| 2005/0023591 | A1* | 2/2005 | Ding | H01L 27/115 257/314 |
| 2005/0111279 | A1* | 5/2005 | Ogura | G11C 11/5671 365/222 |
| 2006/0033145 | A1* | 2/2006 | Kakoschke | G11C 16/0416 257/315 |
| 2006/0267075 | A1* | 11/2006 | Sandhu | H01L 21/28273 257/316 |
| 2012/0113726 | A1 | 5/2012 | Huang et al. | |

FOREIGN PATENT DOCUMENTS

| | | |
|---|---|---|
| CN | 101901813 A | 12/2010 |
| CN | 102456745 A | 5/2012 |
| CN | 102479823 A | 5/2012 |
| CN | 103247626 A | 8/2013 |

\* cited by examiner

SEMI-FLOATING-GATE DEVICE AND ITS MANUFACTURING METHOD

BACKGROUND

1. Technical Field

The disclosure belonging to the technological field of semiconductor memory relates to a semi-floating-gate device and its manufacturing method, and more especially, to a semi-floating-gate device with perpendicular channel region and its manufacturing method.

2. Description of Related Art

Semiconductor memory is widely applied in various electronic products. The requirements for construction, performance, and density of semiconductor memories in different fields are diversified. For instance, static random access memory (SRAM) has high random access rate and low integration density, while dynamic random access memory (DRAM) has high density and medium random access speed.

FIG. 1 shows a planar channeling semiconductor device, comprising: a source region 501 and a drain region 502 with the opposite doping type formed in the semiconductor substrate which can be made of monocrystalline silicon, polysilicon or silicon on insulator. In the semiconductor substrate 500, a channel region 601 of the device is formed between the source region 501 and the drain region 502, wherein the channel region 601 is an inversion layer formed in the semiconductor substrate 500 when the semiconductor device works. The doping region 509 with a high doping concentration is formed in source region 501, and the doping region 510 with a high doping concentration is formed in drain region 502, wherein the doping type of the doping region 509 and the doping region 510 is same to that of the source region 501 and drain region 502.

A first layer of insulation film 503 is formed above the source region 501, the channel region 601 and the drain region 502, and a floating gate opening region 504 is formed in the first layer of insulation film 503 on the drain region 502. A floating gate 505 used as a charge storage node is formed above the first layer of insulation film 503 and covers the channel region 601 and the floating gate opening region 504. The floating gate 505 has the doping type opposite to that of the drain region 502. The doped impurities in the floating gate 505 can be diffused into the drain region 502 through the floating gate opening region 504. A diffusion region 602 is formed due to the spreading of the impurities diffusion of the floating gate 505. Thus a p-n junction diode is formed between the floating gate 505 and the drain region 502 through the floating gate opening region 504 blew the floating gate 505.

A second layer of insulation film 506 is formed due to covering the floating gate 505 and the p-n junction diode structure. A control gate 507 above the second layer of insulation film 506 is formed due to covering and surrounding the floating gate 505 of the gate of the device 508 are formed on both side of the control gate 507. The semiconductor device further comprises the contactor of the source region 511, the contactor of the control gate 507, the contactor of the drain region 513 and the contactor of the semiconductor substrate 514 made of conducting materials, that are used to connect the source region 501, the control gate 507, the drain region 502 and the semiconductor substrate 500 with the external electrode.

To guarantee the function of the semiconductor device, the planar channeling semiconductor device needs longer channel length. But the unit area of semiconductor device will be bigger, and the chip density will be reduced. It will hinder the further development of chips towards miniature direction.

BRIEF SUMMARY

The disclosure aims at providing a semi-floating-gate device with perpendicular channel region so as to reduce the unit area of semiconductor memory and raise the density of chip.

The disclosure provides a semi-floating-gate device with perpendicular channel region. The floating gate is half-floating, because the floating gate connects the drain region with p-n junction diode. The semi-floating-gate device specifically comprising:

a semiconductor substrate with the first doping type;

a perpendicular channel region formed in the semiconductor substrate;

the bottom of the perpendicular channel region is connected with a source region with the second doping type, and the top of the perpendicular channel region is connected with a drain region with the second doping type;

a first layer of insulation film formed due to covering the source region, the drain region and the perpendicular channel region;

a floating gate opening region formed in the first layer of insulation film which covers the perpendicular channel region and lies above the semiconductor substrate;

a floating gate with the first doping type which covers the first layer of the insulation film and the floating gate opening region as the charge storage node and lies above the perpendicular channel region and the floating gate opening region, and a p-n junction diode formed between floating gate and the drain region through the floating gate opening region; the floating gate can control the conducting current of the perpendicular channel region by controlling conducting field, because the floating gate covered on the first layer of the insulation film of the perpendicular channel region;

a second layer of insulation film formed due to covering the source region, the floating gate and the p-n junction diode;

a control gate which lies above the second layer of insulation film formed due to covering the floating gate and the p-n junction diode.

In the semi-floating-gate device described above, the first doping type is n type, the second doping type is p type; alternatively, the first doping type is p type, and the second doping type is n type.

In the semi-floating-gate device described above, the first layer and the second layer of insulation film are made of silicon dioxide, silicon nitride, silicon oxynitride or insulation materials with high dielectric constant, and the floating gate is made of doped polysilicon, and the control gate is made of metal, alloy, or doped polysilicon.

In the semi-floating-gate device described above, the p-n junction diode, the second insulation film, and the control gate form a gated diode with the control gate as the gate, wherein the anode of the gated diode are connected with the floating gate region, and the cathode is connected with the drain region; alternatively, the cathode of the gated diode is connected with the floating gate region, and the anode is connected with the drain region.

Furthermore, the disclosure also puts forward a method for manufacturing the semi-floating-gate device above, comprising:

form a lightly-doped region with the second doping type in the semiconductor substrate with the first doping type;

deposit a hard mark layer on the surface of the semiconductor substrate, and, define the location of a perpendicular channel region via photolithographic process and etching process;

etch out the semiconductor substrate exposed by using the hard mask layer as mask to form the perpendicular channel region for the device, and the etching depth is greater than the depth of the lightly-doped region with the second doping type, here, after etching, one part of the lightly-doped region with the second doping type will be left to form a drain region for the device;

etch out the left hard mask layer;

form a first layer of insulation film on the surface of the semiconductor substrate exposed, then form a floating gate opening region via etching the first layer of insulation film, wherein the floating gate opening region is on the top of the perpendicular channel region and expose the drain region;

then, deposit and form a first layer of conducting film with p-type doping type on the exposure surface of the structure formed, and form a floating gate via etching the first layer of conducting film, wherein the floating gate at least cover the formed perpendicular channel region and the floating gate opening region;

then, form a second layer of insulation film on the exposure surface of the formed structure;

deposit and form a second layer of conducting film on the second layer of insulation film, then form a control gate for the device via photolithography and etching the second layer of conducting film;

perform ion injection of the second doping type, and conduct doping to the control gate and the semiconductor substrate not covered by the control gate to form the a structure doped with source region, drain region and control gird.

In the method described above, the first doping type is n type, the second doping type is p type; alternatively, the first doping type is p type, and the second doping type is n type.

In the method described above, the first layer and the second layer of insulation film are made of silicon dioxide, silicon nitride, silicon oxynitride or insulation materials with high dielectric constant, the first layer of conducting film is made of doped polysilicon, the second layer of conducting film is made of metal, alloy, or doped polysilicon;

The semi-floating-gate device disclosed in the disclosure using the floating gate to store information and realizing charging or discharging of the floating gate through gated p-n junction diode boasts small unit area high chip density and low operating voltage in data storage and strong ability in data retain.

DETAILED DESCRIPTION

The disclosure is further detailed in combination with the drawings and the embodiments. In the figures, to facilitate illustration, the thickness of the layer and region is magnified, so the size does not represent the actual dimension. The reference figures are the schematic views of a typical embodiment for the disclosure. The embodiment shall not be limited to the specific sizes in the regions shown in the figures, but include all the shapes obtained, for example, a size with a deviation caused in manufacturing. For instance, the curve obtained through etching is generally bent or round. However, in the embodiment of the disclosure, it is indicated by a rectangle, which shall not be regarded as a limit to the scope of the disclosure.

Figure 1:
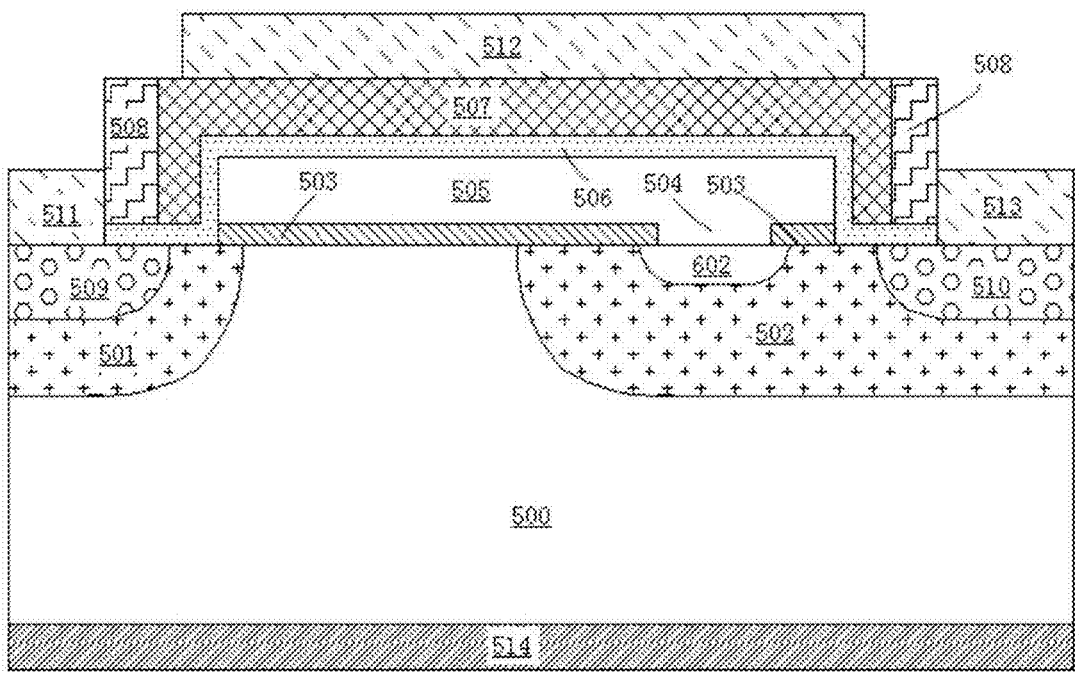
FIG. 1 is a sectional view of existing semiconductor memory.
Figure 2A:
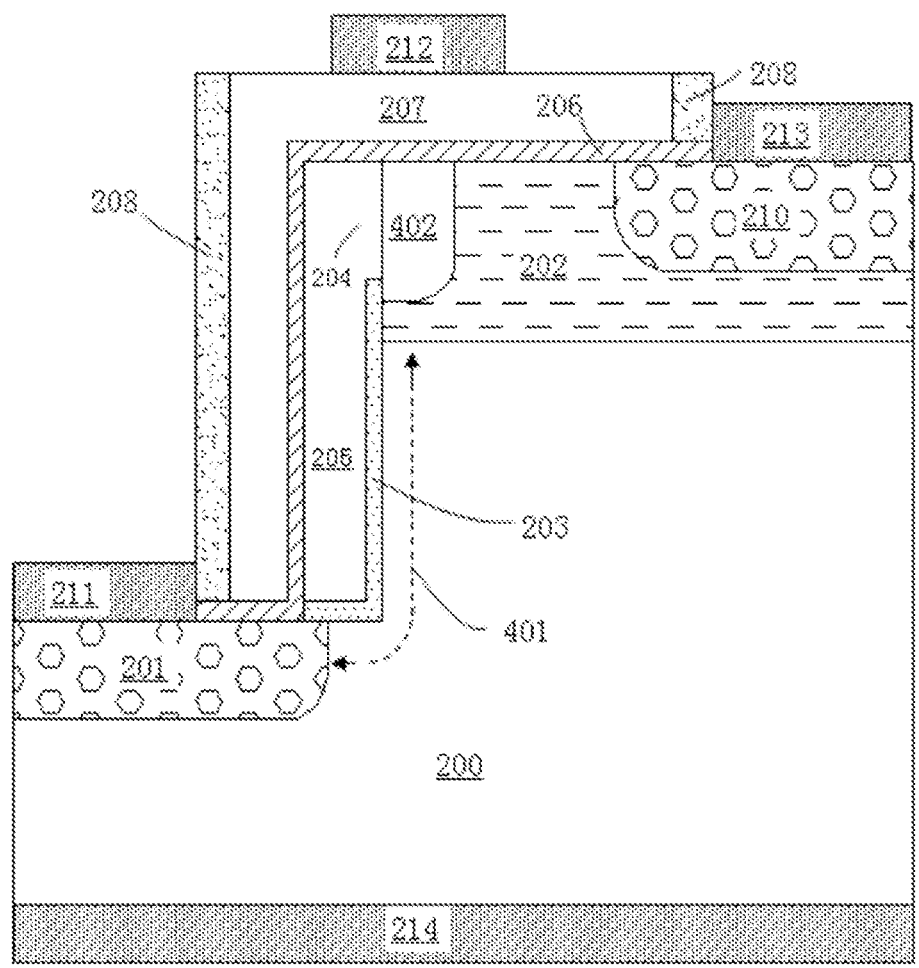
FIG. 2 is a sectional view of an embodiment of the semi-floating-gate device and an equivalent circuit diagram according to the disclosure.

FIG. 2a show three sectional views of an embodiment of the semi-floating-gate device disclosed in the disclosure along the length direction the device's channel. As shown in FIG. 2a, the semi-floating-gate device disclosed in the disclosure comprise a semiconductor substrate 200 with the first doping type and a perpendicular channel region 401 formed in the semiconductor substrate, wherein the perpendicular channel region 401 is an inversion layer formed in the semiconductor substrate 200 when the semiconductor device works. A source region 201 with the second doping type is formed in the bottom of the perpendicular channel region 401 and a drain region 202 with the second doping type is formed in the top of the perpendicular channel region 401. The semiconductor substrate 200 can be made of monocrystalline silicon, polysilicon or silicon on insulator. The first doping type is n type, the second doping type is p type, alternatively, the first doping type is p type, and the second doping type is n type.

A first layer of insulation film 203 formed due to covering the source region, the drain region and the perpendicular channel region. A floating gate opening region 204 formed due to covering the first layer of insulation film 203 of the drain region 202 in the top of the perpendicular channel region 401. The first layer of insulation film 203 may be made of silicon dioxide, silicon nitride, silicon oxynitride, or insulation materials with high dielectric constant, and the physical thickness preferably ranges from 1 nm to 20 nm.

A floating gate 205 with the first doping type used as a charge storage node is above the first layer of insulation film 203 formed due to covering the channel region 401 and the floating gate opening region 204. The floating gate 205 has the doping type opposite to that of the drain region 202. The doped impurities in the floating gate 205 can be diffused into the drain region 202 through the floating gate opening region 204 to further form a diffusion region 402 with the first doping type, thus a p-n junction diode is formed between the floating gate 205 and the drain region 202 through the floating gate opening region 204.

A second layer of insulation film 206 is formed due to covering the floating gate 205 and the p-n junction diode structure, wherein the second layer of insulation film 206 may be made of silicon dioxide, silicon nitride, silicon oxynitride or insulation materials with high dielectric constant, and the physical thickness preferably ranges from 1 nm to 20 nm.

A control gate 207 which lies above the second layer of insulation film 206 is formed due to covering the floating gate 205 and the p-n junction diode, wherein the control gate 207 can be made of metal, alloy or doped polysilicon.

Number 208 is a side wall of the gate of the device made of silicon dioxide or silicon nitride. The side wall 208 is a well-known structure in this field for isolating the control gate 207 from other conducting layers of the device.

A doping region 210 is formed in the drain region 202, wherein the doping type of the doping region 210 is same to that of the drain region 202. The doping regions 210 have a doping concentration greatly higher than that of the source region 202 so as to reduce the ohmic contact of device.

The semi-floating-gate device disclosed in the disclosure further comprises the contactor of the source region 211, the contactor of the control gate 212, the contactor of the drain region 213 and the contactor of the semiconductor substrate 214 made of conducting materials are used to connect the source region 201, the control gate 207, the drain region 202 and the semiconductor substrate 200 with the external electrode.

Figure 2B:
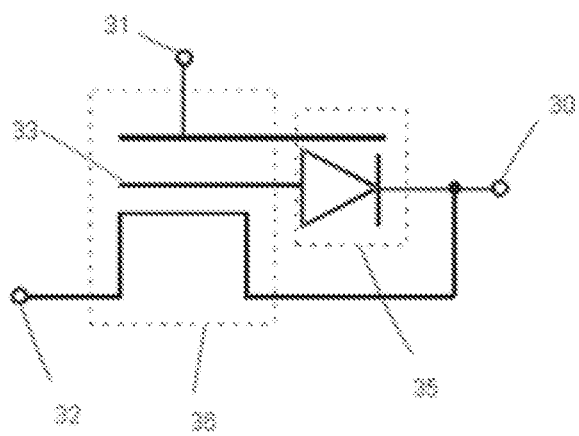

In order to further detail the structure and function of the semi-floating-gate device disclosed in the disclosure, FIG. 2b shows an equivalent circuit diagram of the semi-floating-gate device. As shown in FIG. 2b, the semi-floating-gate device disclosed in the disclosure comprises a MOSFET 36 and a gated diode 35 with the control gate 31 of MOSFET 36 as the gate, wherein the MOSFET 36 has source electrode 32, drain electrode 30, floating gate 33 and control gate 31. The floating gate 33 of MOSFET 36 can be connected with the anode or cathode of the gated diode 35. In the embodiment of the disclosure shown in the FIG. 2b, the floating gate 33 is connected with the anode of the gated diode 35. The floating gate 33 is charged or discharged by the gated diode 35 to change the number of the charges in the floating gate 33. The number of the charges determines the logic state of the semi-floating-gate device, and that means it has current or not in the perpendicular channel region.

The semi-floating-gate device disclosed in the disclosure can be manufactured via many methods. The description below is the flow chart for manufacturing an embodiment of the semi-floating-gate device with n-type channel shown in FIG. 2a.

Figure 3:
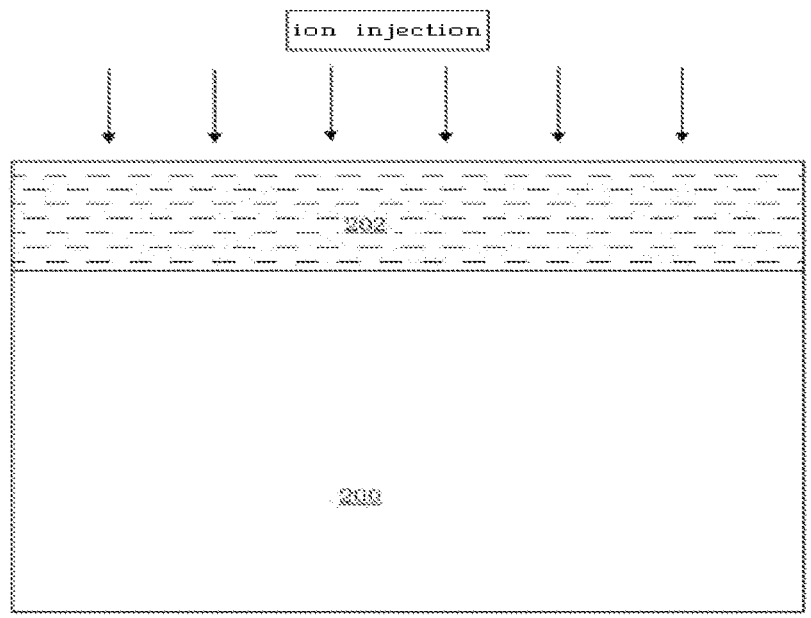
FIGS. 3 to 10 are flow charts of an embodiment of the method for manufacturing the semi-floating-gate device according to the disclosure.

Firstly, as shown in FIG. 3, form a source region (not shown) in the semiconductor substrate 200 with the first doping type through the shallow trench isolation (STI) process. This STI process is well known in this field. Conduct ion injection of the second doping type into the semiconductor substrate 200 to form a lightly-doped region 300. The semiconductor substrate 200 can be made of monocrystalline silicon, polysilicon or silicon on insulator. The first doping type is p type, and the second doping type is n type.

Figure 4:
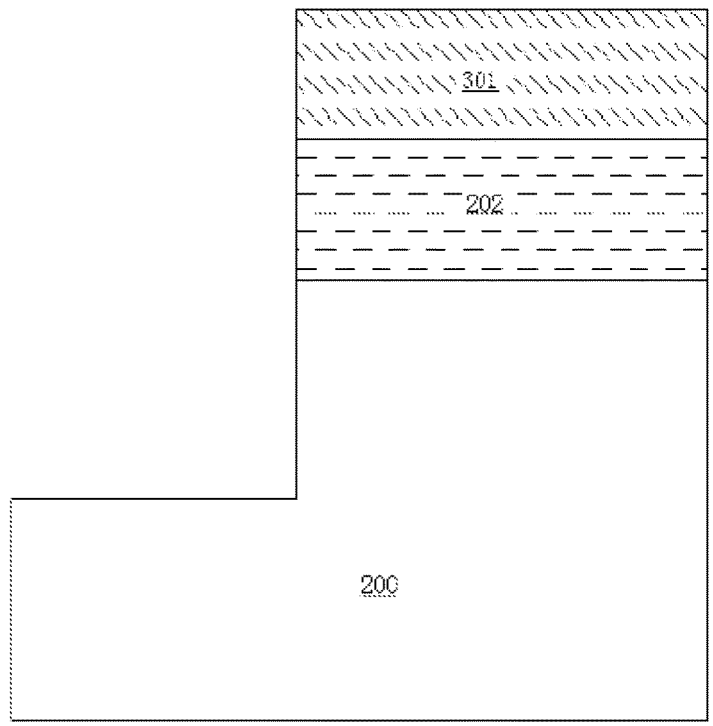

Afterwards, deposit a hard mark layer 301 on the surface of the semiconductor substrate, wherein the hard mark layer 301 can be made of silicon nitride. Then deposit a layer of optical resist 302 on the hard mark layer 301, and expose and develop it to define the position of the perpendicular channel region for device, and etch out the exposure hard make layer 301, and etch out the exposure semiconductor substrate 200 by using the hard mask layer as mask to form the perpendicular channel region in the semiconductor substrate 200. The etching depth is greater than the depth of the lightly-doped region 300 with the second doping type. After etching, one part of the lightly-doped region 300 with the second doping type will be left to form a drain region 202 for the device, shown as FIG. 4.

Figure 5:
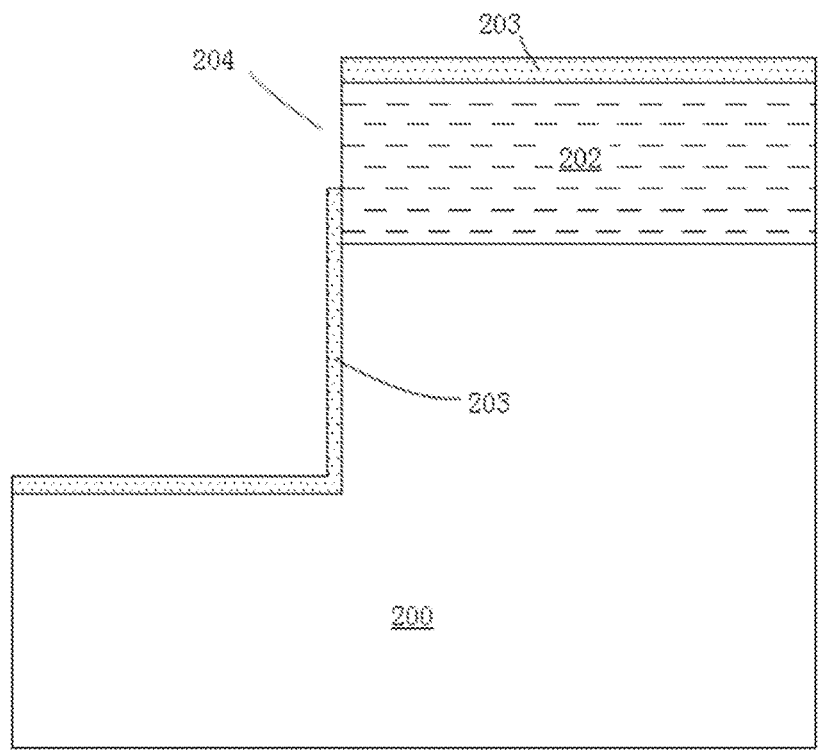

Afterwards, remove the optical resist 303 and continue to etch out the left hard mask layer 301, and then form a first layer of insulation film 203 on the surface of the exposure semiconductor substrate 200, wherein the first layer of insulation film 203 can be made of silicon dioxide, silicon nitride, silicon oxynitride or insulation materials with high dielectric constant, and the physical thickness preferably ranges from 1 nm to 20 nm. Then, deposit a layer of optical resist on the insulation film 203, and define the location of the floating gate opening region via the photolithographic process, and etch out the first layer of insulation film 203 exposed to form the floating gate opening region 204. FIG. 5 shows the condition after the optical resist is removed.

Figure 6:
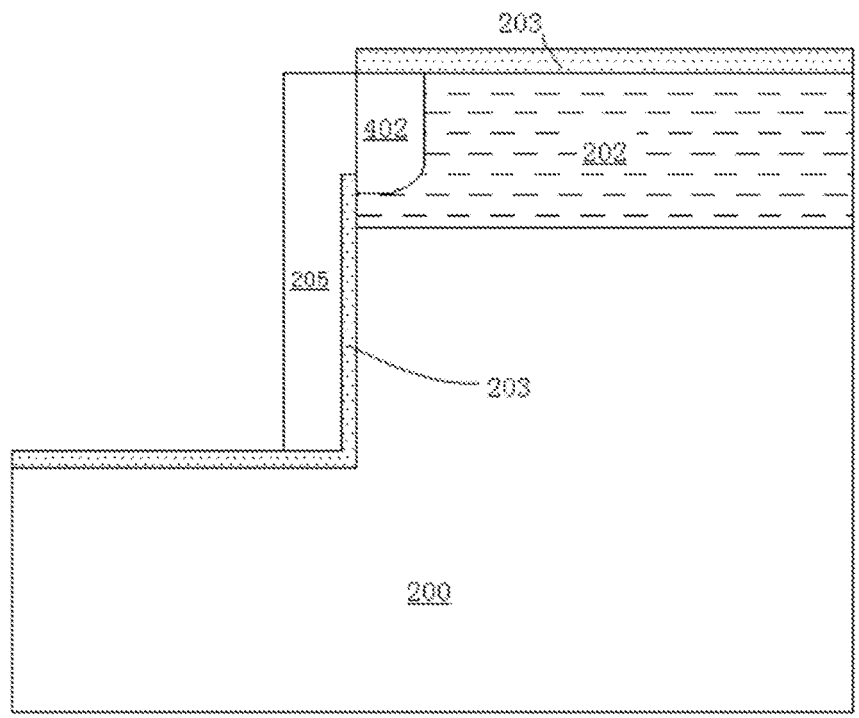

Next, deposit and form a first layer of conducting film on the exposure surface of the structure formed, wherein the conducting film is made of polysilicon with p-type doping type. Then, form a floating gate 205 via etching the first layer of conducting film, wherein the floating gate 205 at least covers the perpendicular channel region and the floating gate opening region 204. The impurities doped in the floating gate 205 may be diffused into the drain region 202 through the floating gate opening region 204 below the floating gate 205 to form p-type diffusion region 402, and a p-n junction diode is formed between the floating region 205 and the drain region 202 through the floating gate opening region 204. FIG. 6 shows the condition after the optical resist is removed.

Figure 7:
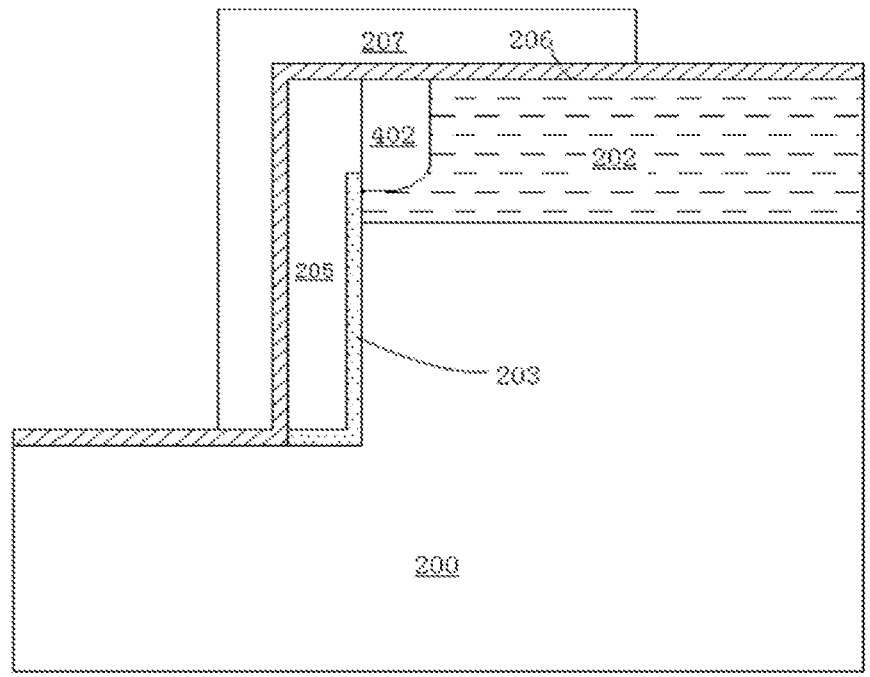

Next, continue to etch out the first layer of insulation film 203 exposed and deposit and form a second layer of insulation film 206 on the exposure surface of the structure formed, wherein the second layer of insulation film 206 can be made of silicon oxide, silicon nitride, silicon oxynitride or insulation materials with high dielectric constant, and the physical thickness preferably ranges from 1 nm to 20 nm. Deposit and form a second layer of conducting film 207 on the second layer of insulation film 206, wherein the second layer of conducting film 207 can be made of metal, alloy or doped polysilicon. Then, deposit a layer of optical resist on the second layer of conducting film 207, and define the location of the control gate via the photolithographic process, then etch out the second layer of conducting film exposed and form the control gate 207 of the device with the remaining second layer of conducting film 207, wherein the control gate 207 should cover the floating gate and the p-n junction diode formed. FIG. 7 shows the condition after the optical resist is removed.

Figure 8:
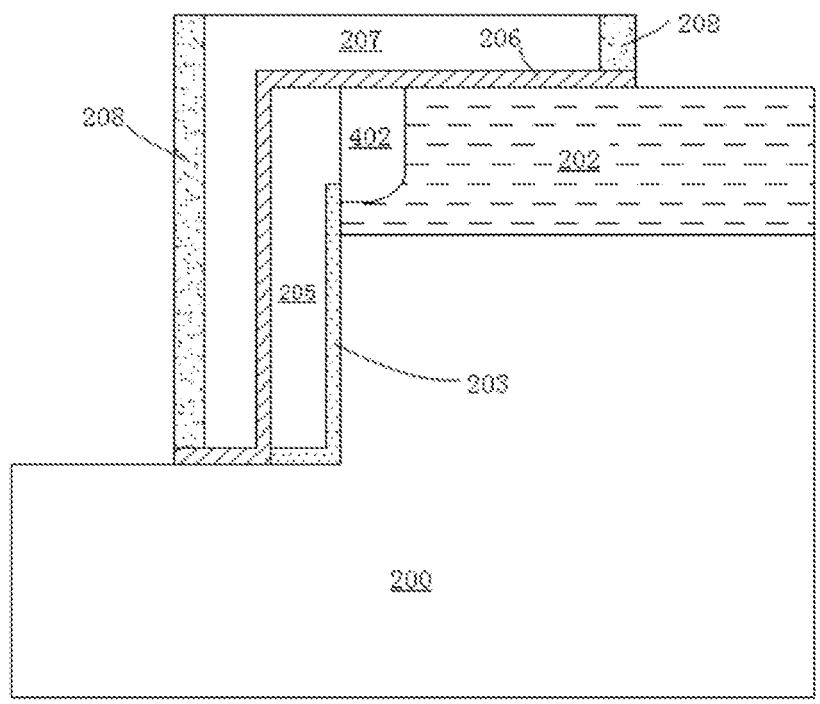

Next, deposit and form a third layer of conducting film on the exposure surface of the structure formed, then deposit a layer of optical resist on the third layer of conducting film formed, and form a graph via the photolithographic process, and etch out the third layer of conducting film exposed, and continue to etch out the second layer of insulation film 206 exposed and form the side wall of gate 208 on the both sides of the control gate 207 with the remaining third layer of conducting film. This process is well known in this field. FIG. 8 shows the condition after the optical resist is removed. The side wall of gate 208 can be made of silicon oxide or silicon nitride.

Figure 9:
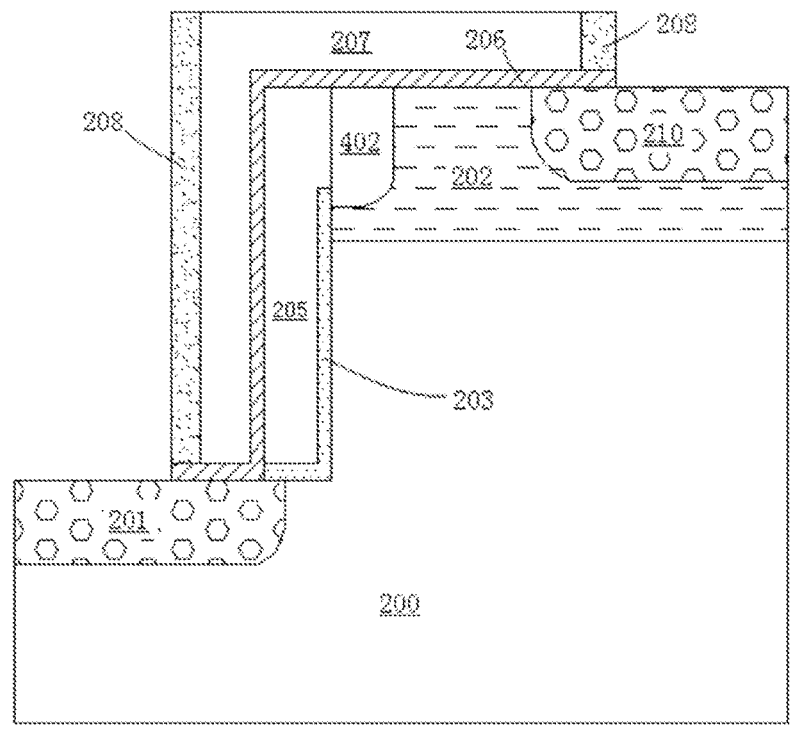

Then, perform impurity ion injection of the second doping type (n type), and conduct doping to the control gate 207 and the semiconductor substrate 200 not covered by the control gate 207 to form a self-aligned structure doped with source region 201, and form doping regions 210 with high concentration in the drain region 202, as shown in FIG. 9.

Figure 10:
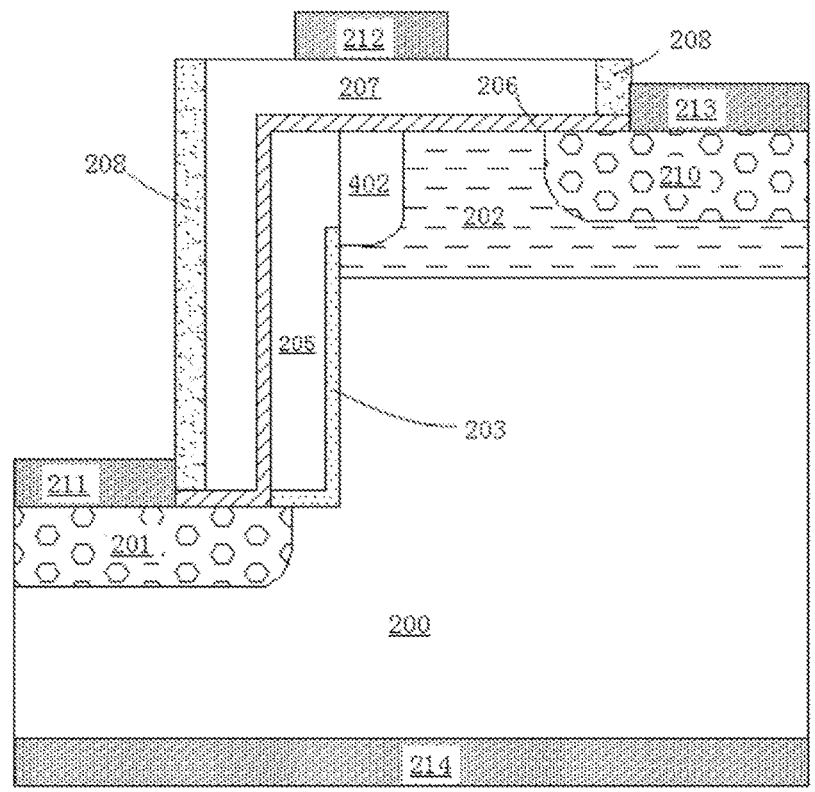

Finally, form the contactor of the source region 211, the contactor of the control gate 212, the contactor of the drain region 213 and the contactor of the semiconductor substrate 214 made of conducting materials and used to connect the source region 201, the control gate 207, the drain region 202 and the semiconductor substrate 200 with the external electrode, as shown in FIG. 10.

As described above, many embodiments with great difference may be formed under the premise that the spirit and scope of the disclosure are not deviated. It shall be understood that, the disclosure is not limited by the specific embodiment in the Specification, but restricted to the claims only.

INDUSTRIAL APPLICABILITY

The semi-floating-gate device disclosed in the invention using the floating gate to store information and realizing charging or discharging of the floating gate through gated p-n junction diode boasts small unit area, high chip density and low operating voltage in data storage and strong ability in data retain.

What is claimed is:

1. A method for manufacturing a semi-floating-gate device, the method comprising:
   providing a semiconductor substrate of a first doping type;
   forming a lightly-doped region of a second doping type in the semiconductor substrate which comprises the first doping type;
   depositing a hard mask layer on a surface of the semiconductor substrate;
   defining a location of a perpendicular channel region in the semiconductor substrate via a photolithographic process and an etching process, wherein a bottom of the perpendicular channel region is connected with a source region of the second doping type and a top of the perpendicular channel region is connected with a drain region of the second doping type;
   etching out an exposed surface of the semiconductor substrate by using the hard mask layer as a mask to form the perpendicular channel region, wherein an etching depth is greater than a depth of the lightly-doped region such that, after etching, one part of the lightly-doped region will be left to form the drain region;
   etching out any remaining hard mask layer;
   forming a first layer of insulation film on the exposed surface of the semiconductor substrate to cover the source region, the drain region, and the perpendicular channel region;
   forming the floating gate opening region via etching the first layer of insulation film, wherein the floating gate opening region is disposed on top of the perpendicular channel region and exposes the drain region;
   depositing and forming a first layer of conducting film with p-type doping type which covers the first layer of insulation film and the floating gate opening region and forming a floating gate via etching the first layer of conducting film, wherein the floating gate at least covers the perpendicular channel region and the floating gate opening region;
   forming a second layer of insulation film which covers the source region, the floating gate, and a p-n junction diode formed between the floating gate and the drain region;
   depositing and forming the second layer of conducting film on the second layer of insulation film, then forming a control gate via photolithography and etching the second layer of conducting film; and
   performing ion injection of the second doping type and conducting doping to the control gate and the semiconductor substrate not covered by the control gate to form a doped structure comprising the source region, the drain region, and the control gate.

2. The method of claim 1, further comprising:
   providing a contactor of the source region, a contactor of the control gate, a contactor of the drain region, and a contactor of the semiconductor substrate,
   wherein each contactor comprises conducting materials and respectively connects the source region, the control gate, the drain region, and the semiconductor substrate with an external electrode.

3. The method of claim 1, wherein the first doping type is n type and the second doping type is p type or, alternatively, wherein the first doping type is p type and the second doping type is n type.

4. The method of claim 1, wherein the first and second layers of insulation film comprise silicon dioxide, silicon nitride, silicon oxynitride, or insulation materials with a high dielectric constant, wherein the first layer of conducting film comprises doped polysilicon, and wherein the second layer of conducting film comprises a metal, an alloy, or a doped polysilicon.

* * * * *